United States Patent [19]
Hoshino et al.

[11] Patent Number: 5,828,551
[45] Date of Patent: Oct. 27, 1998

[54] HEAT SINK APPARATUS FOR AN ELECTRONIC COMPONENT

[75] Inventors: Izumi Hoshino, Nitta-machi; Hideo Matsushima, Kiryu, both of Japan

[73] Assignee: Hoshino Kinzoku Koygo Kabushiki Kaisha, Japan

[21] Appl. No.: 827,616

[22] Filed: Apr. 9, 1997

[30] Foreign Application Priority Data

Mar. 4, 1997 [JP] Japan ................................ 9-065380

[51] Int. Cl.⁶ .................................................. H05K 7/20
[52] U.S. Cl. ......................... 361/697; 361/695; 361/704; 361/709; 361/710; 257/706; 257/707; 257/717; 257/718; 257/719; 257/721; 257/722; 257/727; 174/16.3; 165/803
[58] Field of Search .................................... 361/695, 697, 361/704, 707, 709, 710; 165/80.2, 80.3; 174/16.3; 257/706, 707, 718, 719, 727

[56] References Cited

U.S. PATENT DOCUMENTS

| | | |
|---|---|---|
| 5,099,550 | 3/1992 | Beane et al. . |
| 5,287,249 | 2/1994 | Chen . |
| 5,299,632 | 4/1994 | Lee . |
| 5,309,983 | 5/1994 | Bailey . |
| 5,335,722 | 8/1994 | Wu . |
| 5,368,094 | 11/1994 | Hung . |
| 5,377,745 | 1/1995 | Hsieh . |
| 5,409,352 | 4/1995 | Lin .......................... 361/695 |
| 5,421,402 | 6/1995 | Lin . |
| 5,430,610 | 7/1995 | Hung . |
| 5,493,475 | 2/1996 | Lin . |
| 5,494,098 | 2/1996 | Morosas . |
| 5,495,392 | 2/1996 | Shen . |
| 5,504,650 | 4/1996 | Katsui et al. . |
| 5,519,574 | 5/1996 | Kodama et al. .................. 361/697 |
| 5,519,575 | 5/1996 | Chiou . |
| 5,522,700 | 6/1996 | Hong . |
| 5,544,013 | 8/1996 | Chiou . |
| 5,582,506 | 12/1996 | Hong . |

*Primary Examiner*—Leo P. Picard
*Assistant Examiner*—Boris Chervinsky
*Attorney, Agent, or Firm*—Christensen O'Connor Johnson & Kindness PLLC

[57] ABSTRACT

A heat sink apparatus of the present invention comprises a heat conductive base comprising a plate member having a first surface and a second surface, a plurality of heat dissipation fins projecting upwardly from the first surface and extending radially toward a circumference of the plate member, the second surface being adapted to be in contact engagement with a surface of the electronic device, the first surface slopping down radially toward the circumference of the plate member, and a fan assembly mounted above the heat dissipation fins. The second surface is substantially flat and a thickness of the plate member decreases radially toward the circumference of the plate member. The heat dissipation fins are arranged to define a non-finned zone of the first surface and the non-finned zone is a concave. The heat sink apparatus further comprises a casing includes an upper wall, a lower surface of which is positioned adjacent to upper edges of the heat dissipation fins.

19 Claims, 9 Drawing Sheets

HEAT SINK APPARATUS FOR AN ELECTRONIC COMPONENT

TECHNICAL FIELD

The invention relates to a cooling device for an electronic component and more particularly to a heat sink apparatus for a MPU (micro processing unit) and the like.

BACKGROUND OF THE INVENTION

Because of a high integration of a device, a heat generated from the MPU becomes an intolerable level. It is, therefore, necessary to suppress a temperature of the MPU by using a heat sink apparatus. The heat sink apparatus usually comprises a base having a plurality of heat dissipation fins and a fan assembly supplying a cooling air to the base. This kind of heat sink apparatus is disclosed in U.S. Pat. Nos. 5522700, 5287249, 5368094, 5309983, 5421402, 5409352, 5099550, 5377745, 5519575, 5544013, 5582506, 5504650, 5299632, 5430610, 5584339, 5493475, 5495392, 5494098, 5335722, for example.

For the heat sink apparatus, a good cooling effect and a simple attachment and assembly of the apparatus are required. Some of the above-mentioned US patents are directed to the latter requirement and succeed in this respect. It is, however, very difficult to achieve a desired cooling effect while maintaining a compact size and a simple construction of the apparatus. In addition, recent developments in high integration technology have substantially increased the amount of heat generated from the MPU.

The present invention is mainly directed to achieve the above-mentioned requirements.

An object of the present invention is to improve the cooling effect of the heat sink apparatus by providing an efficient flow of the cooling air.

Another object of the present invention is to improve an assembly and an attachment of the heat sink apparatus.

SUMMARY OF THE INVENTION

A heat sink apparatus of the present invention comprises a heat conductive base comprising a plate member having a first surface and a second surface, a plurality of heat dissipation fins projecting upwardly from the first surface and extending radially toward a circumference of the plate member, the second surface being adapted to be in contact engagement with a surface of the electronic device, the first surface slopping down radially toward the circumference of the plate member, and a fan assembly mounted above the heat dissipation fins. More particularly, the second surface is substantially flat and a thickness of the plate member decreases radially toward the circumference of the plate member.

Preferably, the heat dissipation fins are arranged to define a non-finned zone of the first surface and the non-finned zone is a concave.

In a preferred aspect of the invention, the heat sink apparatus further comprises a casing having a size corresponding to the plate member, the casing includes an upper wall having an opening to receive the fan assembly and a lower surface of the upper wall is positioned adjacent to upper edges of the heat dissipation fins. Preferably, the lower surface of the upper wall slopes down toward a circumference of the upper wall.

A plurality of receiving holes are provided on a casing of the fan assembly and a plurality of pins are projected from the first surface corresponding to the receiving holes. The opening has a shape corresponding to the fan assembly and the fan assembly is fitted in the opening. Preferably, a recess portion is provided at an edge of the opening to receive a fan motor wire.

In another preferred aspect of the invention, the heat sink apparatus further comprises a holder for holding the electronic device which has a plurality of projections on two opposite sides thereof and the casing has a plurality of fastening means on two opposite sides thereof.

Preferably, the fastening means comprises a first clamping arm and a second clamping arm, the first arm is extended downwardly from one side of the casing and the second arm is detachably secured to the other side of the casing. The second arm is a tension lever having a lower end and an upper end, the lower end is provided with an engaging means to engage with the projection of the holder and the upper end is engaged with an engaging projection provided on an extended portion of the other side of the casing. The clamping arms are provided with at least one hole positioned at an outlet of an air passage to facilitate flowing a cooling air.

The casing can be directly attached to the electronic device when the electronic device is not provided with the holder. In this case, the casing may further comprises a side wall extended downwardly from an edge of the upper wall and a plurality of slits are provided in the side wall corresponding to the outlets of the air passages to flow the cooling air therethrough. A plurality of clamping members are provided at a lower end of the side wall which are engaged with a shoulder of the electronic device by a snap-fit joint for example.

DETAILED DESCRIPTION OF THE PREFERRED EMBODIMENTS

A heat sink 1 comprises a rectangular plate member 2 and a plurality of heat dissipation fins 3. The plate member 2 has a first surface 2a and a second surface 2c and the heat dissipation fins 3 are projected upwardly from the first surface 2a. The heat dissipation fins 3 are extended radially toward a circumference of the plate member 2 and define air flow passages therebetween. The heat dissipation fins 3 are arranged to define a circular non-finned zone 2b of the first surface 2a. The non-finned zone 2b is positioned substantially in a center portion of the first surface 2a and is a concave in which a thickness of the non-finned zone 2b is thinner than that of the major portion of the plate member 2. One ends of the heat dissipation fins 3 are facing perpendicularly to a circular circumference of the non-finned zone 2b and the other ends of the heat dissipation fins 3 are extending towards the circumference of the plate member 2. The heat dissipation fins 3 consist of a longer fin and a shorter fin which are arranged one after the other so that a good air flow passage is provided between the heat dissipation fins 3 in the vicinity of the non-finned zone 2b.

Figure 2:
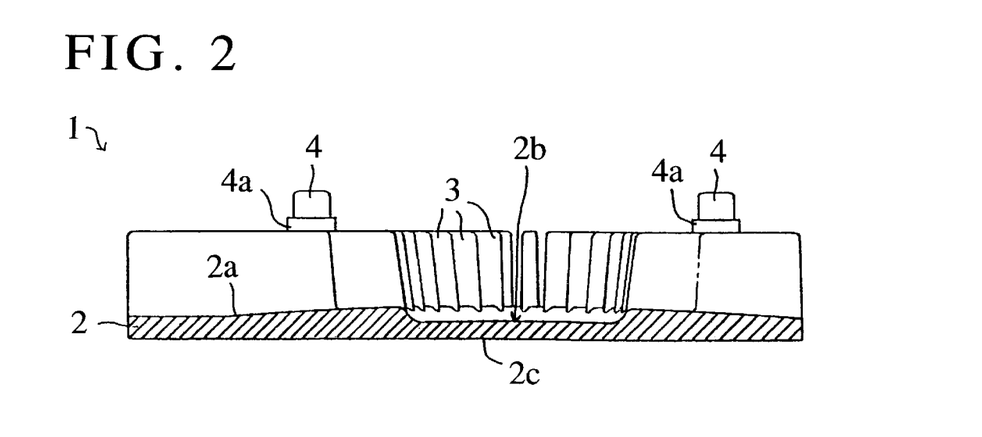
FIG. 2 is a cross-sectional view of the heat sink along the line II—II in the FIG. 1
Figure 3:
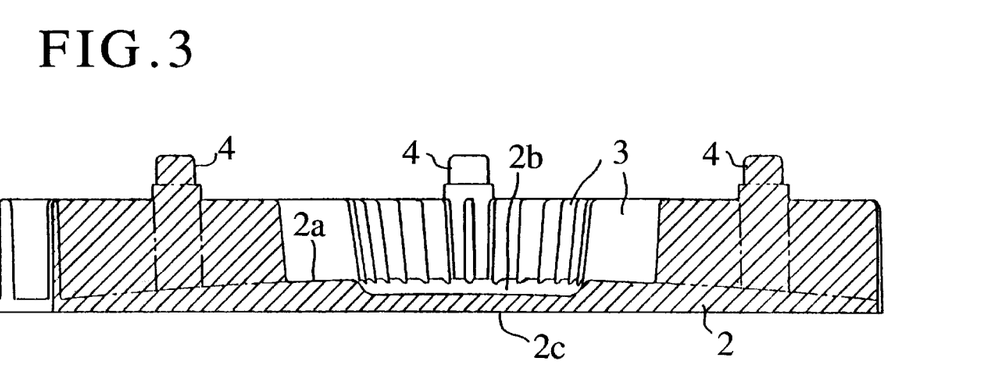
FIG. 3 is a cross-sectional view of the heat sink along with the line III—III in the FIG. 1.
Figure 4:
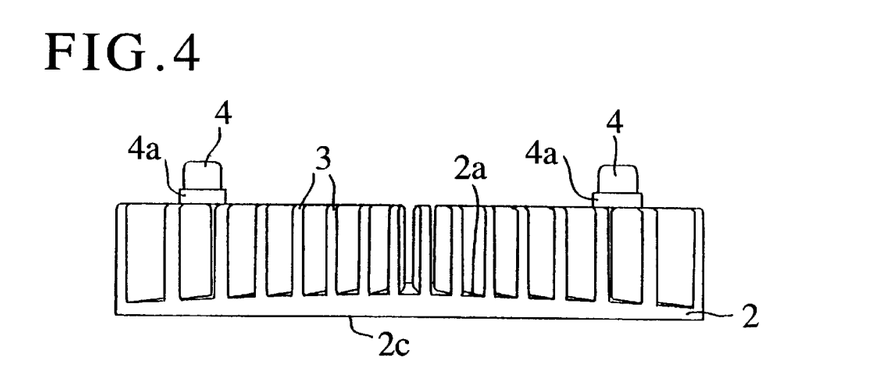
FIG. 4 is a side view of the heat sink seen from the arrow IV in the FIG. 1.

It appears from the cross sectional views that the first surface 2a slops down radially from an edge of the non-finned zone 2b toward the circumference of the plate member 1. The second surface 2c is substantially flat and a thickness of the plate member 2 decreases radially toward the circumference of the plate member 2. In other words, the thickness of the plate member 2 decreases along with the extending directions of the radial heat dissipation fins 3.

Figure 5:
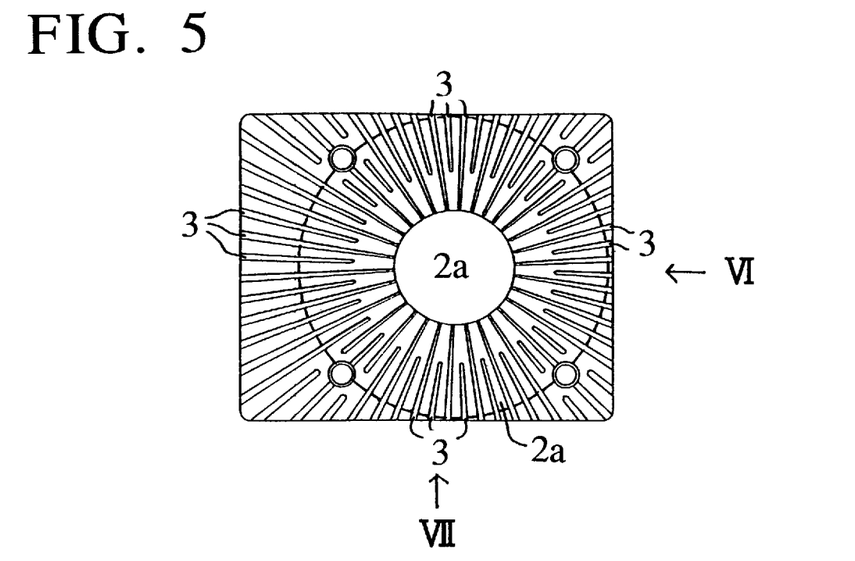
FIG. 5 is a plan view of a heat sink in accordance with another preferred embodiment of the invention.
Figure 6:
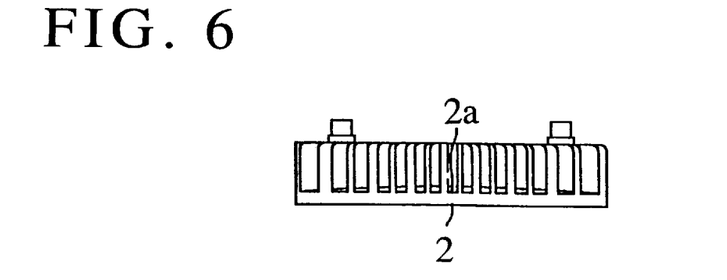
FIG. 6 is a side view of the heat sink seen from the arrow VI in the FIG. 5.
Figure 7:
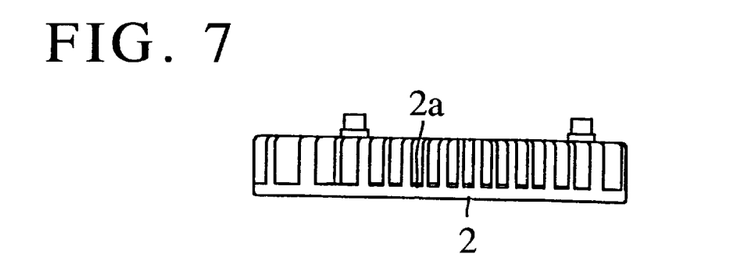
FIG. 7 is a side view of the heat sink seen from the arrow VII in the FIG. 5.
Figure 8:
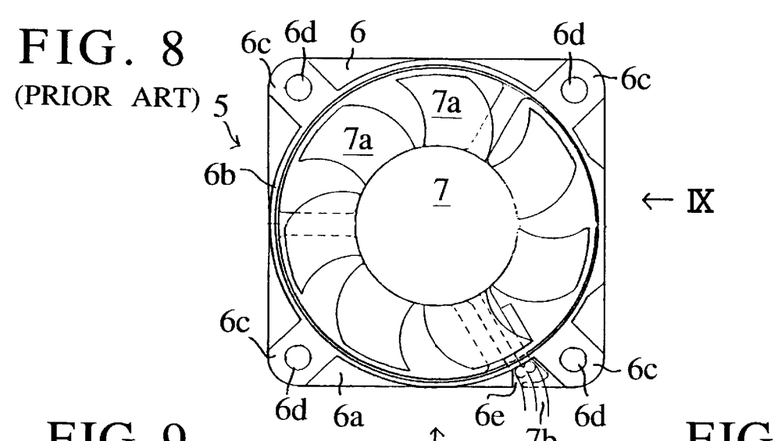
FIG. 8 is a plan view of a fan assembly.
Figure 9:
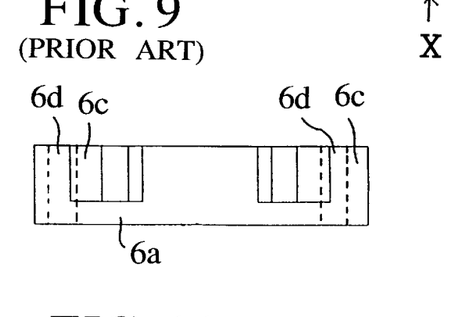
FIG. 9 is a side view of the fan assembly seen from the arrow IX in the FIG. 8.
Figure 10:
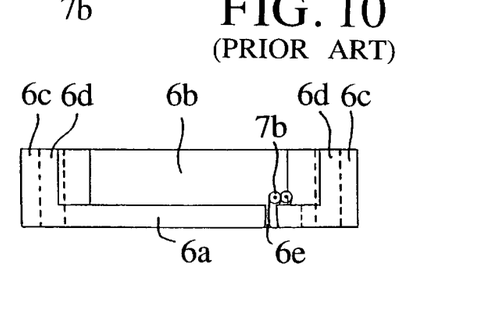
FIG. 10 is a side view of the fan assembly seen from the arrow X in the FIG. 8.
Figure 11:
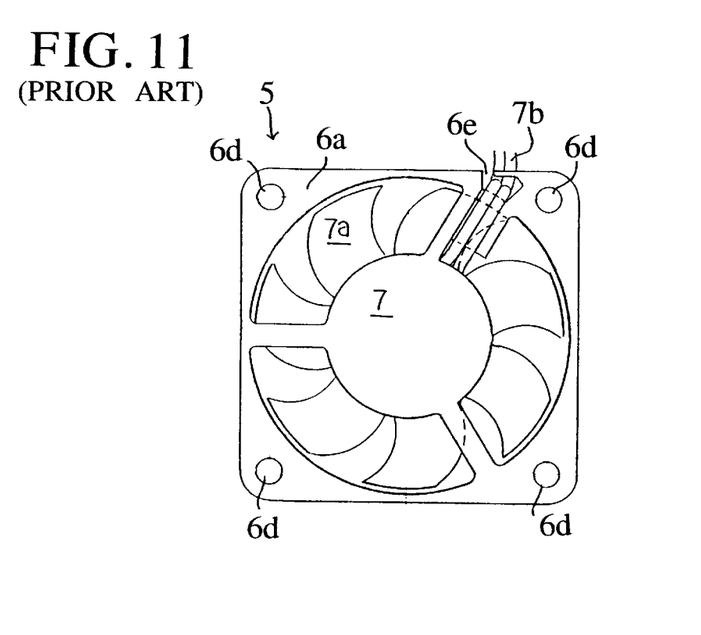
FIG. 11 is a bottom view of the fan assembly seen from the below.

The shape of the plate member 2 in the drawing is a rectangle having a longer side and a shorter side. It is merely because a shape of a holder 13 for an electronic device 12, MPU for example, is a rectangular. The shape of the plate member 2 is not limited to a rectangle but can be a square for example. The heat sink 1 is made of a material having a good heat conductivity and is made of an aluminum for example. FIGS. 5 to 7 show another embodiment of the heat sink 1 in which a circular portion of the first surface 2a slopes down from the edge of the non-finned zone 2b toward an edge of the circular portion and corner portions of the first surface 2a is substantially flat.

Figure 1:
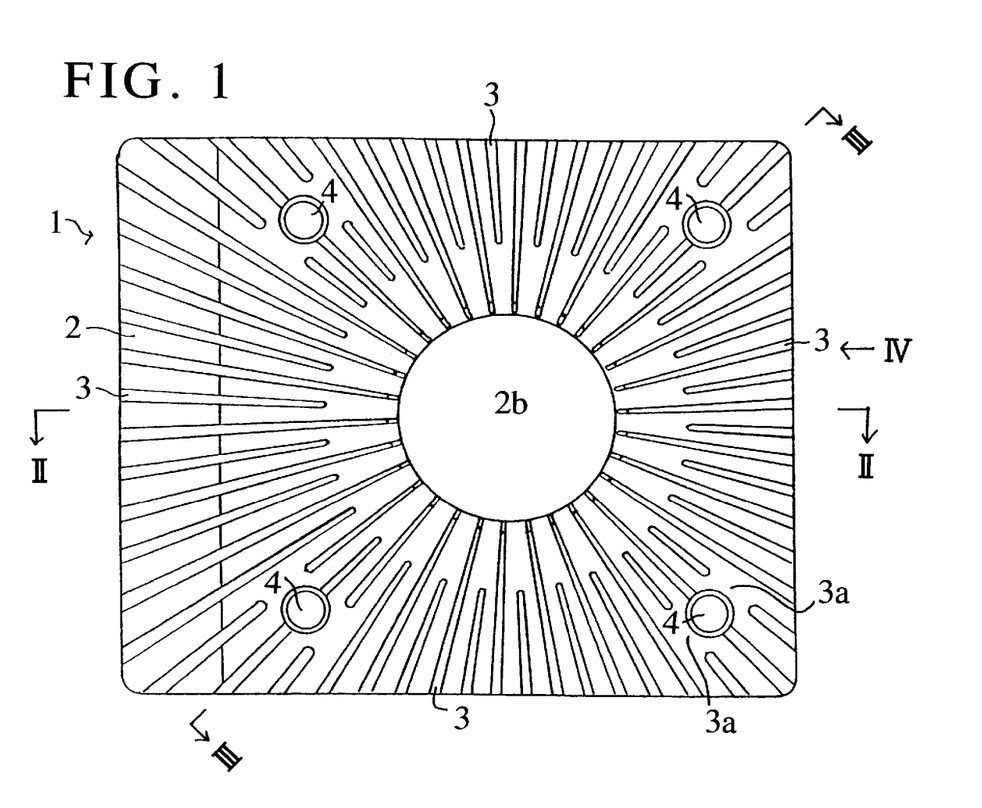
FIG. 1 is a plan view of a heat sink in accordance with a preferred embodiment of the invention.

The plate member 2 is provided with a plurality of pins 4 which are projected from the first surface 2a. The pins 4 are projected from the heat dissipation fins 3 and the fins 3 adjacent to those fins 3 with pins 4 have a cutout 3a so that the pins 4 do not prevent a cooling air from flowing between the fins 3.

A fan assembly 5 comprises a rectangular fan casing 6 and a rotating fan 7 having a plurality of blades 7a. The rotating fan 7 is rotatably mounted in an opening which is provided in a center portion of the fan casing 6. The rotating fan 7 is driven by a motor therein and supply a cooling air generally perpendicularly to the first surface 2a of the heat sink 1. The fan casing 6 comprises a bottom wall 6a having a circular opening, a short cylindrical side wall 6b extended upwardly from a rim of the opening, and four columns 6c projected from corners of the bottom wall 6a. Each column 6c has a receiving hole therethrough to receive the pin 4 provided on the first surface 2a of the plate member 2. The fan casing 6 has a cutout 6e which is provided in the bottom wall 6a in the vicinity of one column 6c to receive a wire 7b connected to the fan motor.

Figure 12:
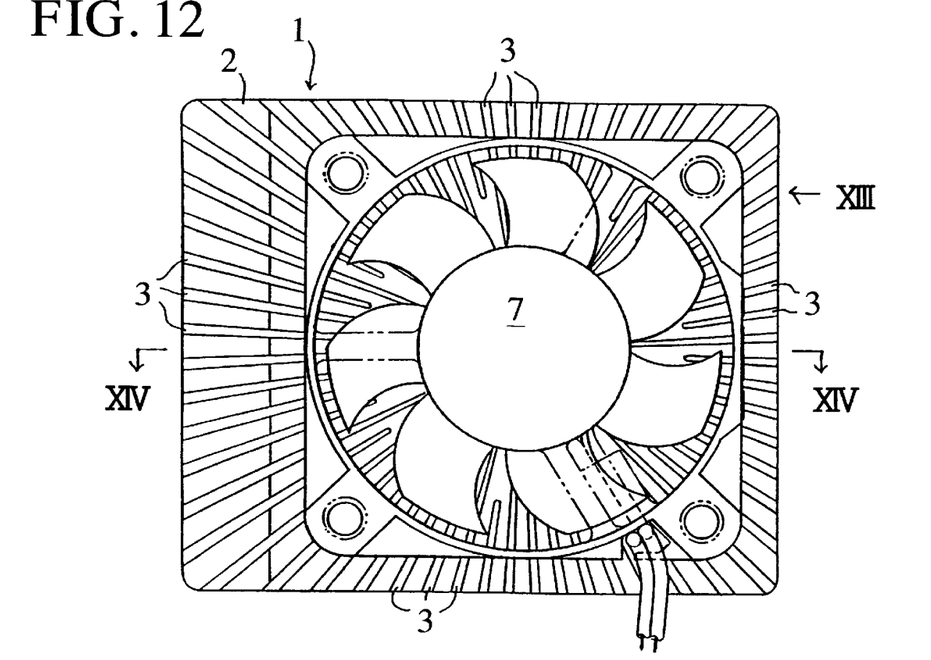
FIG. 12 is a plan view of an assembly of the heat sink and the fan assembly.
Figure 13:
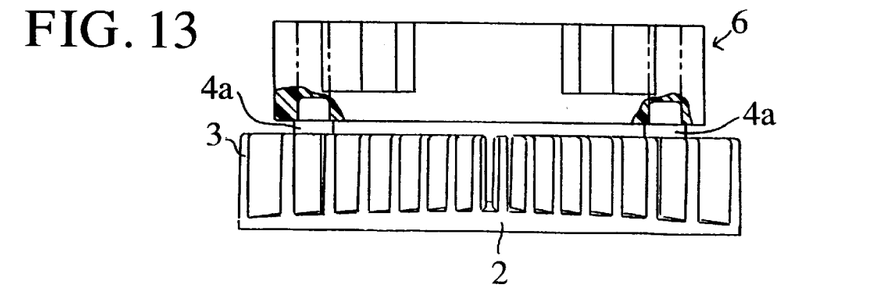
FIG. 13 is a side view of the assembly seen from the arrow XIII in FIG. 12.
Figure 14:
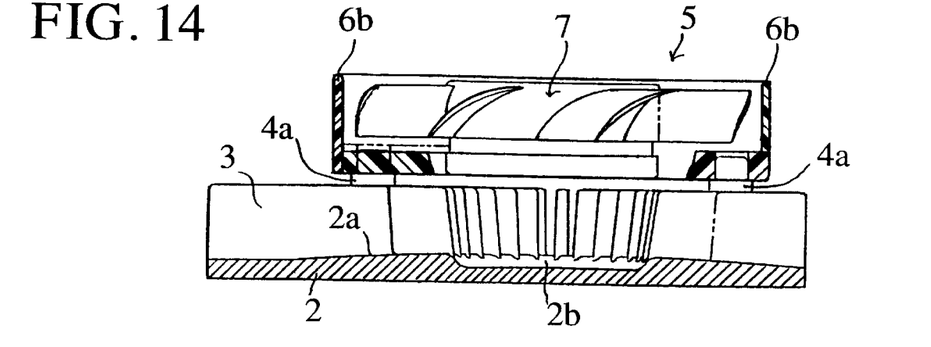
FIG. 14 is a cross-sectional view along the line XIV—XIV in FIG. 12.

The pin 4 has a bottom portion 4a which has a lager radius than the radius of receiving hole 6 of the fan casing 6 and the bottom portion 4a serves as a spacer to provide a clearance between an upper edge of the fin 3 and the bottom wall 6a of the fan casing 6. A size of the heat sink 1 is larger than that of the fan assembly 5 so that a peripheral portion of the heat sink 1 is exposed when the fan assembly 5 is mounted above the heat sink 1.

A casing 8 is to be mounted on the heat sink 1. The casing 8 has a rectangular upper wall 8a, a size of which corresponds to the size of the plate member 2 of the heat sink 1. The upper wall 8a of the casing 8 is provided with an opening 9 which has a size and a shape correspond to those of the side wall 6b of the fan casing 6. The opening 9 has a generally circular shape with cutouts 9a to receive the columns 4 and a circumference of the opening 9 is provided with a rim 9b which is slightly protruded from a surface of the upper wall 8a. A lower surface of the rim 9b is to be rested upon an upper surface of the bottom wall 6a of the fan casing 6. A hole 9c for receiving a wire is provided adjacent to the cutout 9a and is to receive the wire 7b of the fan motor. The holes 9c are opposingly provided on a diagonal line so that a direction of the fan motor attachment can be selected according to a direction of connection to a mother board. As shown in the drawings, a lower surface of the upper wall 8a is positioned close to upper edges of the heat dissipation fins 3 and slopes down toward a circumference of the upper wall 8a to rectify a reflected air flow and guide the cooling air toward the circumference of the heat sink 1.

Figure 15:
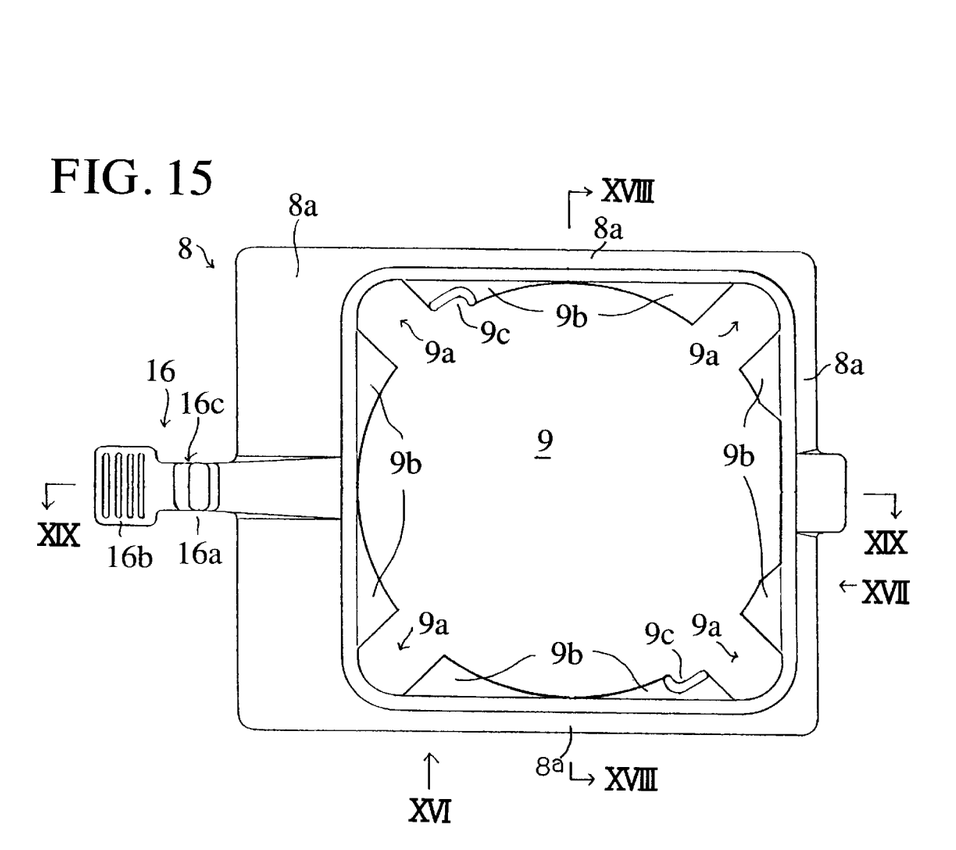
FIG. 15 is a plan view of a casing in accordance with a preferred embodiment of the invention.
Figure 16:
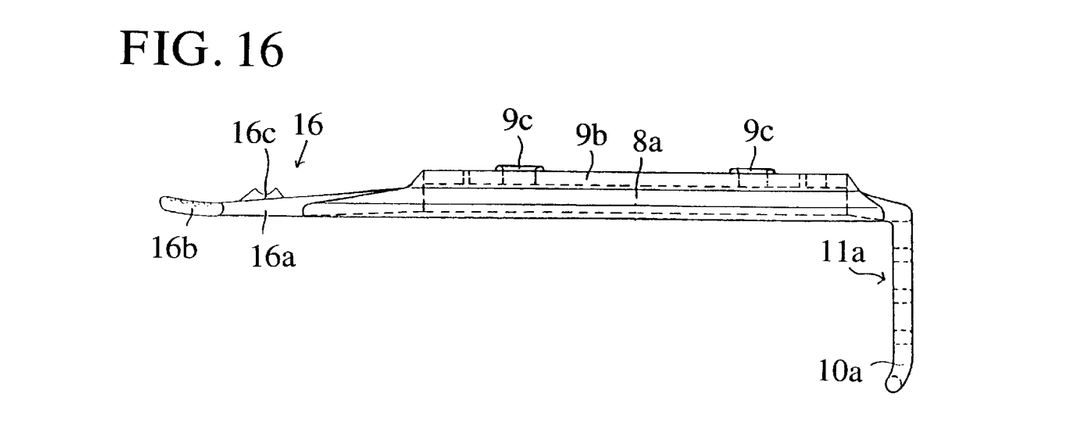
FIG. 16 is a side view of the casing seen from the arrow XVI in FIG. 15.
Figure 17:
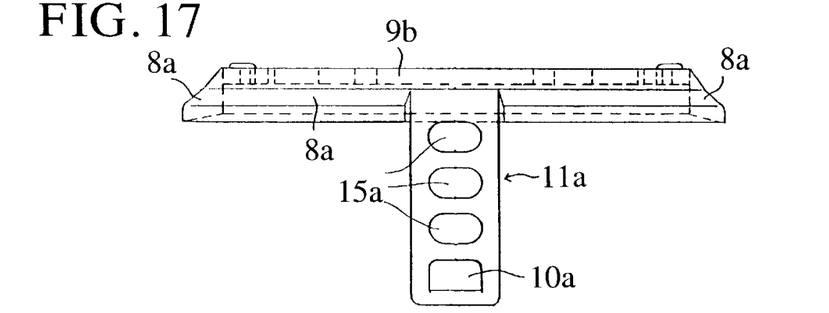
FIG. 17 is a side view of the casing seen from the arrow XVII in FIG. 15.
Figure 18:
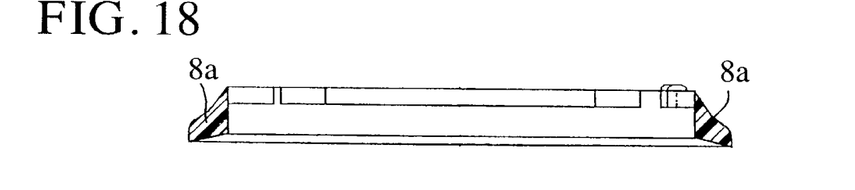
FIG. 18 is a cross-sectional view along the line XVIII—XVIII in FIG. 15.
Figure 19:
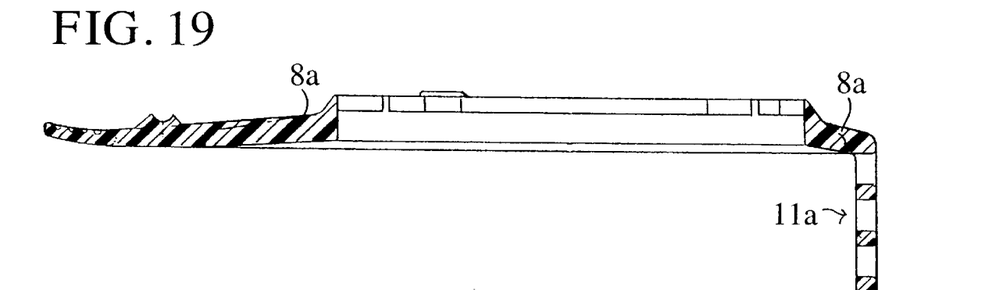
FIG. 19 is a cross-sectional view along the line XIX—XIX in FIG. 15.
Figure 23:
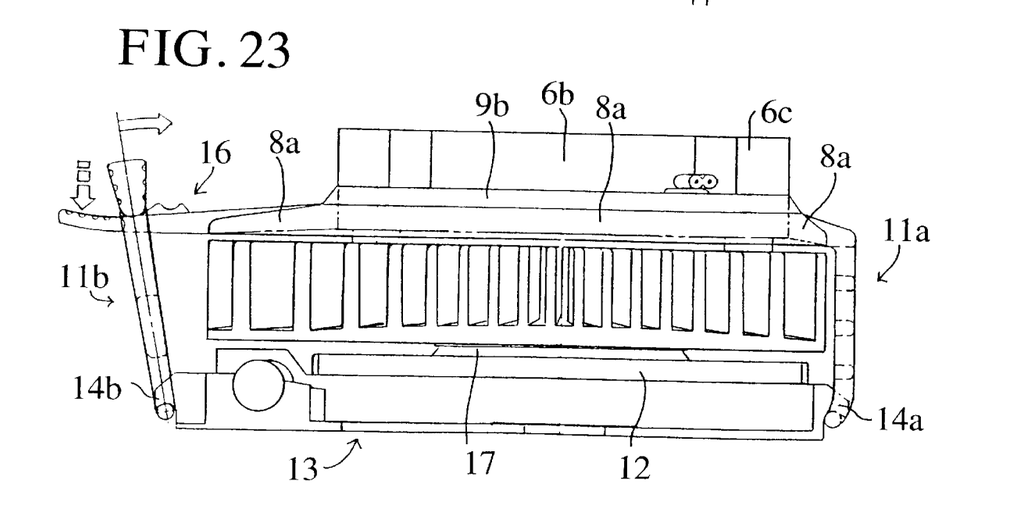
FIG. 23 is a side view showing the assembly attached to an electronic device.

Clamping arms 11a, 11b are opposingly provided at opposite shorter sides of the casing 8. A first clamping arm 11a has an engaging means 10a at a lower end for engaging with a first hook-like portion 14a of a holder 13 holding the electronic component 12. A second clamping arm 11b has an engaging means 10b at a lower end for engaging with a second hook-like portion 14b of the holder 13. The first clamping arm 11a is extended downwardly from a first shorter side of the casing 8 and is provided with a plurality of openings 15a in an extending direction to pass therethrough the cooling air. An opening is provided at the lower end of the clamping arm 11a and is functioned as the engaging means 10a.

Figure 20:
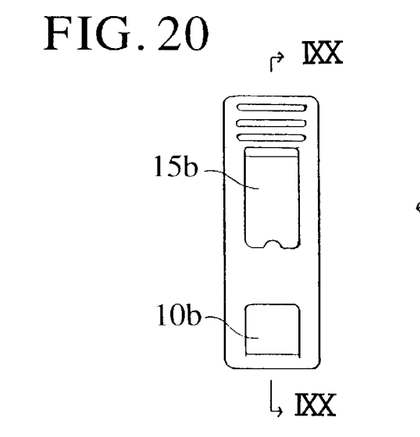
FIG. 20 is a front view of a second clamping arm in accordance with a preferred embodiment of the invention.
Figure 21:
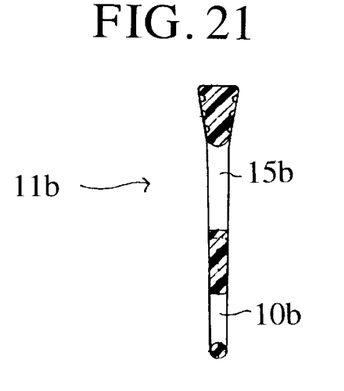
FIG. 21 is a cross-sectional view of the second clamping arm along the line XXI—XXI in FIG. 20.

The second clamping arm 11b is a tension lever which is detachably mounted at the casing 8. The second clamping arm 11b is provided with an elongated opening 15b and a lower opening which is functioned as the engaging means 10b. A dimension of the lower opening of the second clamping arm 11b is longer than that of the first clamping arm 11a. An extended portion 16 is provided at a second shorter side of casing 8. The extended portion 16 comprises a narrow portion 16a and an end portion 16b having a wider width. The narrow portion 16a is provided with an engaging projection 16c to engage with an upper end of the elongated opening 15b.

Figure 22:
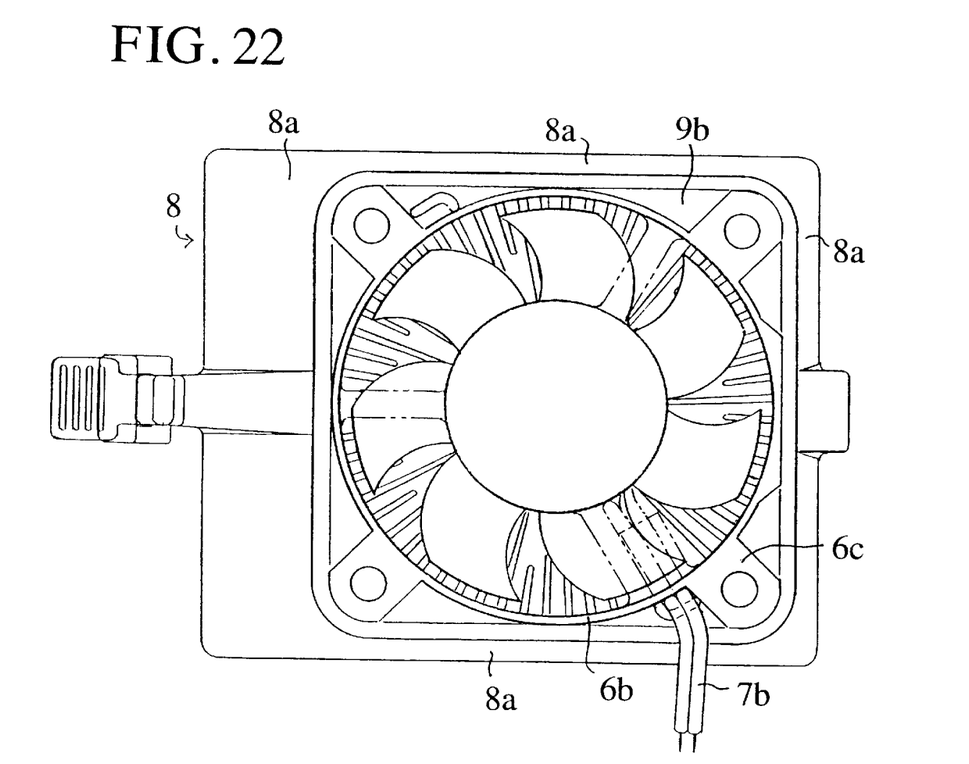
FIG. 22 is a plan view of an assembly of the heat sink, the fan assembly and the casing together with the second clamping arm.

The fan assembly 5 is attached on the heat sink 1 by fitting the pins 4 projected upwardly from the first surface 2a into the receiving holes 6d. Next, the casing 8 is temporarily attached on the fan assembly by fitting the fan casing 6 at the rim 9b of the opening 9. In this stage, the opening 9 receives the side wall 6b and the columns 6c of the casing 6 and the lower surface of the rim 9b rests upon the upper surface of the bottom wall 6a of the casing 6. The wire 7b for the fan motor is extended between the receiving portion 9c provided at the opening 9 of the casing 8 and the side wall 6b of the fan casing 6.

Next, the first clamping arm 11a is engaged with the first projection 14a of the holder 13 and the lower end of the second clamping arm 11b is engaged with the second projection 14b. Then, the upper end portion of the second clamping arm 11b is resiliently engaged with the projection 16c to fix the heat sink assembly to the holder 13 holding the electronic device 12. The casing 8, the extended portion 16 and the clamping arms 11a, 11b are made of a resilient material such as a plastic so that by functioning the second clamping arm 11b as the tension lever, the second surface 2c of the plate member 2 is in tight contact engagement with the surface of the electronic device 12 to conduct the heat from the electronic device 12 to the heat sink 1. Preferably, the electronic device 12 contacts with the second surface 2c of the plate member 2 via a film or a sheet 17 made of a material having a good heat conductivity.

Figure 24:
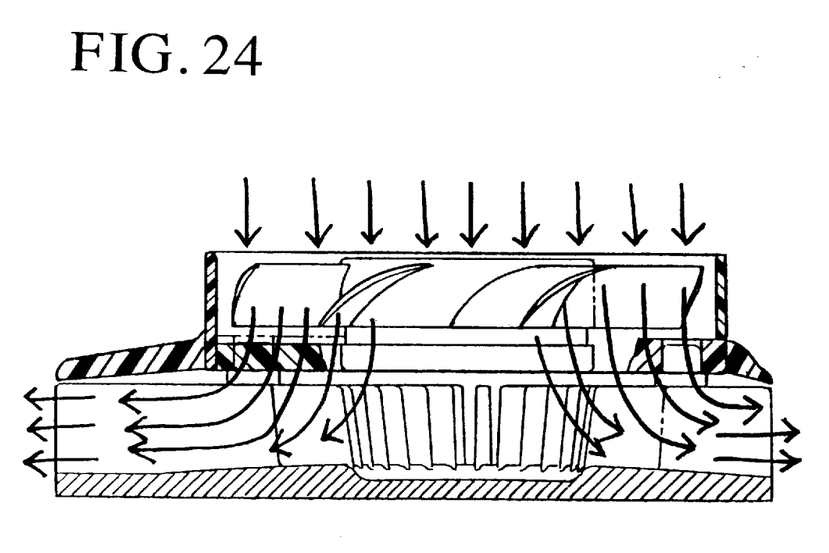
FIG. 24 is a side view, partially in cross-section showing a flow of a cooling air.

According to the above-mentioned heat sink apparatus, when rotating the fan 7 by the fan motor, a flow of the cooling air is supplied substantially perpendicularly to the first surface 2a of the plate member 2. Since the heat dissipation fins 3 are arranged radially toward the circumference of the plate member 2 and the first surface 2a of the plate member 2 slopes down radially toward the circumference of the plate member 2, the air flow which is supplied perpendicularly to the first surface 2a is guided toward the circumference of the plate member 2 through channels which are defined between the heat dissipation fins 3. Some of the air flow which is supplied to the first surface 2a may be reflected from the first surface 2a. According to the present heat sink apparatus, since the casing 8 is provided to cover the upper edges of the exposed heat dissipation fins 3 and the lower surface of the upper wall 8a of the casing 8 slopes down toward the circumference of the casing 8, the reflected air is rectified and guided by the lower surface of the upper wall 8a toward the circumference of the plate member 2. Thus, according to the preferred embodiment of the present invention, the radial heat dissipation fins 3, the sloped first surface 2a and the casing 8 which together form ducts, cooperatively achieve an efficient flow of the cooling air.

What we claim is:

1. A heat sink apparatus adapted to be mounted on and dissipate heat generated in an electronic device, said heat sink apparatus comprising:
   (a) a heat conductive base comprising a plate member having a first surface and a second surface;
   (b) a plurality of heat dissipation fins projecting upwardly from said first surface and extending radially toward a circumference of said plate member;
   (c) said second surface being adapted to be in contact engagement with a surface of said electronic device;
   (d) said first surface slopping down radially toward the circumference of said plate member; and
   (e) a fan assembly mounted above said heat dissipation fins.

2. The heat sink apparatus as claimed in claim 1, wherein said second surface is substantially flat and a thickness of said plate member decreases radially toward the circumference of said plate member.

3. The heat sink apparatus as claimed in claim 1, wherein said fins are arranged to define a non-finned zone of the first surface and said non-fins zone is a concave.

4. The heat sink apparatus as claimed in claim 1, wherein a plurality of receiving holes are provided on a casing of the fan assembly and a plurality of pins are projected upwardly from the first surface corresponding to the receiving holes.

5. The heat sink apparatus as claimed in claim 1, said apparatus further comprising a casing having a size corresponding to the plate member, the casing including an upper wall having an opening to receive the fan assembly, and a lower surface of the upper wall being positioned adjacent to upper edges of the heat dissipation fins.

6. The heat sink apparatus as claimed in claim 5, wherein the lower surface of the upper wall slopes down toward a circumference of the upper wall.

7. The heat sink apparatus as claimed in claim 5, wherein said opening has a shape corresponding to the fan assembly and the fan assembly is fitted in the opening.

8. The heat sink apparatus as claimed in claim 5, wherein a recess portion is provided at an edge of the opening to receive a fan motor wire.

9. The heat sink apparatus as claimed in claim 5, the apparatus further comprising a holder for holding the electronic device, the holder having a plurality of projections on two opposite sides thereof and the casing having a plurality of fastening means on two opposite sides thereof.

10. The heat sink apparatus as claimed in claim 9, the fastening means comprising a first clamping arm and a second clamping arm, the first arm being extended downwardly from one side and the second arm being detachably secured to the other side.

11. The heat sink apparatus as claimed in claim 10, wherein said second arm is a tension lever having a lower end and an upper end, the lower end is provided with an engaging means to engage with the projection of the holder and the upper end is engaged with an engaging projection provided on an extended portion of the other side.

12. The heat sink apparatus as claimed in claim 10, wherein the clamping arms are provided with at least one opening therein to facilitate flowing a cooling air.

13. A cooling apparatus for a CPU comprising:
   (a) a heat sink having a base plate and a plurality of heat dissipation fins projecting upwardly from an upper surface of said base plate;
   (b) a fan assembly supplying cooling air to said heat sink;
   (c) said heat dissipation fins extending in the radial direction toward a circumference of said base plate; and
   (d) said upper surface sloping downwardly in the radial direction toward the circumference of the base plate such that said sloped surface and said radial fins cooperatively guide the cooling air toward the circumference of the base plate.

14. A cooling apparatus for a CPU according to claim 13, wherein the fins are arranged to define a concave nonfinned zone of the upper surface and wherein said upper surface slopes downwardly in the radial direction from an edge of said nonfinned zone toward the circumference of the base plate so as to guide the cooling air toward the circumference of the base plate along channels defined between said fins.

15. A cooling apparatus for a CPU according to claim 13, wherein the cooling air is supplied substantially perpendicularly to the upper surface of the base plate.

16. A cooling apparatus for a CPU according to claim 13, wherein the fan assembly and the fins are opposed.

17. A cooling apparatus for a CPU comprising:
   (a) a heat sink having a base plate and a plurality of heat dissipation fins projecting upwardly from an upper surface of said base plate;
   (b) a fan assembly supplying cooling air to said heat sink;
   (c) said heat dissipation fins extending in the radial direction toward a circumference of said base plate;
   (d) said upper surface sloping downwardly in the radial direction toward the circumference of the base plate;
   (e) a cover plate having a lower surface being positioned adjacent upper edges of the fins and extending toward the circumference of the base plate to cover the exposed upper edges of the fins; and
   (f) ducts being formed by said sloped upper surface, said lower surface of the cover plate and channels defined between the fins, and said ducts guiding the cooling air toward the circumference of the base plate.

18. A cooling apparatus for a CPU according to claim 17, wherein the fan assembly is opposed against a radially inner area of the radial fins and wherein the lower surface of the cover plate extends over an exposed outer area of the radial fins.

19. A cooling apparatus for a CPU according to claim 17, said apparatus further comprising:
   (a) a plurality of pins that are projected upwardly from the upper surface of the baseplate;
   (b) a plurality of receiving holes that are provided in corner portions of a fan casing of the fan assembly to receive said pins;
   (c) an aperture that is provided in the cover plate to receive the fan casing, and an edge of the aperture resting on a circumference of the fan casing; and
   (d) a plurality of arms that are extended downwardly from the cover plate to resiliently catch the CPU device.

* * * * *

UNITED STATES PATENT AND TRADEMARK OFFICE
CERTIFICATE OF CORRECTION

PATENT NO. : 5,828,551  Page 1 of 3
DATED : October 27, 1998
INVENTOR(S) : I. Hoshino et al.

It is certified that error appears in the above-identified patent and that said Letters Patent is hereby corrected as shown below:

COLUMN        LINE

[57]              Abstract              "slopping" should read --sloping--
Pg. 1, col. 2     line 8 of
                  text

[57]              Abstract              "is a concave" should read --is concave--
Pg. 1, col. 2     line 14 of
                  text 1                 16                    before "cooling air" delete "a"

1                 49                    "slopping" should read --sloping--

1                 57                    "is a concave" should read --is concave--

1                 60                    "includes" should read --including--

2                 3                     "recess" should read --recessed--

2                 25                    "comprises" should read --comprise--

2                 26                    "extended" should read --extending--

UNITED STATES PATENT AND TRADEMARK OFFICE
CERTIFICATE OF CORRECTION

PATENT NO. : 5,828,551
DATED : October 27, 1998
INVENTOR(S) : I. Hoshino et al.

Page 2 of 3

It is certified that error appears in the above-identified patent and that said Letters Patent is hereby corrected as shown below:

| COLUMN | LINE | |
|---|---|---|
| 2 | 40 | after "along" delete "with" |
| 3 | 17 | after "cross-section" insert --,-- |
| 3 | 18 | before "cooling air" delete "a" |
| 3 | 43 | "slops" should read --slopes-- |
| 3 | 53 | before "MPU" insert --a-- |
| 3 | 53 | before "rectangular" delete "a" |
| 3 | 56 | after "conductivity" please delete "and is made of an" and insert therefor --,-- |
| 4 | 5 | "supply" should read --supplies-- |
| 4 | 15 | "lager" should read --larger-- |
| 4 | 27 | "correspond" should read --corresponding-- |
| 4 | 54 | "is functioned" should read --functions-- |
| 4 | 59 | "is functioned" should read --functions-- |
| 5 | 2 | "projected" should read --which project-- |
| 5 (Claim 1, | 64 line 11) | "slopping" should read --sloping-- |

UNITED STATES PATENT AND TRADEMARK OFFICE
CERTIFICATE OF CORRECTION

PATENT NO. : 5,828,551
DATED : October 27, 1998
INVENTOR(S) : I. Hoshino et al.

It is certified that error appears in the above-identified patent and that said Letters Patent is hereby corrected as shown below:

| COLUMN | LINE | |
|---|---|---|
| 6 (Claim 3, | 7 line 3) | "non-fins" should read --non-finned-- |
| 6 (Claim 3, | 7 line 3) | "is a concave" should read --is concave-- |
| 6 (Claim 4, | 10 line 3) | "are projected" should read --project-- |
| 6 (Claim 8, | 25 line 2) | "recess" should read --recessed-- |
| 6 (Claim 12, | 45 line 3) | before "cooling air" delete "a" |
| 8 (Claim 19, | 9 line 4) | "baseplate" should read --base plate-- |

Signed and Sealed this

Eleventh Day of July, 2000

Attest:

Q. TODD DICKINSON

*Attesting Officer*     *Director of Patents and Trademarks*